United States Patent
Sai et al.

(10) Patent No.: US 7,771,065 B2
(45) Date of Patent: Aug. 10, 2010

(54) OPTICAL UNIT AND EXPOSURE APPARATUS HAVING THE SAME

(75) Inventors: Choshoku Sai, Utsunomiya (JP); Shigeo Sakino, Higashimurayama (JP); Katsumi Asada, Utsunomiya (JP); Hirohito Ito, Utsunomiya (JP); Shinji Uchida, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/402,059

(22) Filed: Apr. 12, 2006

(65) Prior Publication Data

US 2006/0232866 A1   Oct. 19, 2006

(30) Foreign Application Priority Data

Apr. 14, 2005   (JP) .............................. 2005-116586

(51) Int. Cl.
*G02B 5/08* (2006.01)
*G02B 7/188* (2006.01)
*G02B 26/08* (2006.01)

(52) U.S. Cl. ..................... 359/847; 359/224.1; 359/849

(58) Field of Classification Search ................. 359/489, 359/849, 848, 882, 224.1
See application file for complete search history.

(56) References Cited

U.S. PATENT DOCUMENTS

| | | | | |
|---|---|---|---|---|
| 4,744,675 A | | 5/1988 | Sakino et al. | 384/12 |
| 4,844,603 A | * | 7/1989 | Eitel et al. | 359/845 |
| 4,993,823 A | * | 2/1991 | Schaffer et al. | 359/849 |
| 5,909,272 A | | 6/1999 | Osanai et al. | 355/53 |
| 6,028,376 A | | 2/2000 | Osanai et al. | 310/12 |
| 6,236,490 B1 | | 5/2001 | Shen | 359/247 |
| 6,359,679 B1 | | 3/2002 | Ito et al. | 355/75 |
| 6,398,373 B1 | | 6/2002 | Guzman et al. | 359/846 |
| 6,842,277 B2 | | 1/2005 | Watson | 359/291 |
| 7,019,878 B2 | * | 3/2006 | Mikami | 359/216 |
| 2002/0128733 A1 | | 9/2002 | Sakino | 700/56 |
| 2003/0234970 A1 | * | 12/2003 | Phillips et al. | 359/291 |
| 2004/0017623 A1 | | 1/2004 | Watson | 359/849 |
| 2004/0027632 A1 | * | 2/2004 | Watson | 359/223 |
| 2004/0144915 A1 | | 7/2004 | Wagner et al. | 250/216 |
| 2004/0257683 A1 | * | 12/2004 | Petasch et al. | 359/847 |
| 2006/0232866 A1 | | 10/2006 | Sai et al. | 359/849 |

FOREIGN PATENT DOCUMENTS

| | | |
|---|---|---|
| JP | 2003-519404 | 6/2003 |
| JP | 2004-064076 | 2/2004 |
| JP | 2004-064706 | 2/2004 |
| WO | WO 2004057407 A1 * | 7/2004 |

OTHER PUBLICATIONS

European Search Report dated Nov. 5, 2007, issued in corresponding European patent application No. EP 06 00 7718, forwarded in a Communication dated Nov. 16, 2007.

* cited by examiner

*Primary Examiner*—Stephone B Allen
*Assistant Examiner*—Jade R Callaway
(74) *Attorney, Agent, or Firm*—Fitzpatrick, Cella, Harper & Scinto

(57) ABSTRACT

An optical unit including a plate, an optical element, a fixing device for partially fixing the optical element against the plate, and a deforming device, located between the plate and the optical element, for applying a deforming force to the optical element to change a surface shape of the optical element. The deforming device includes poles for contacting a back face of the optical element, and actuators for driving the poles against the plate.

11 Claims, 14 Drawing Sheets

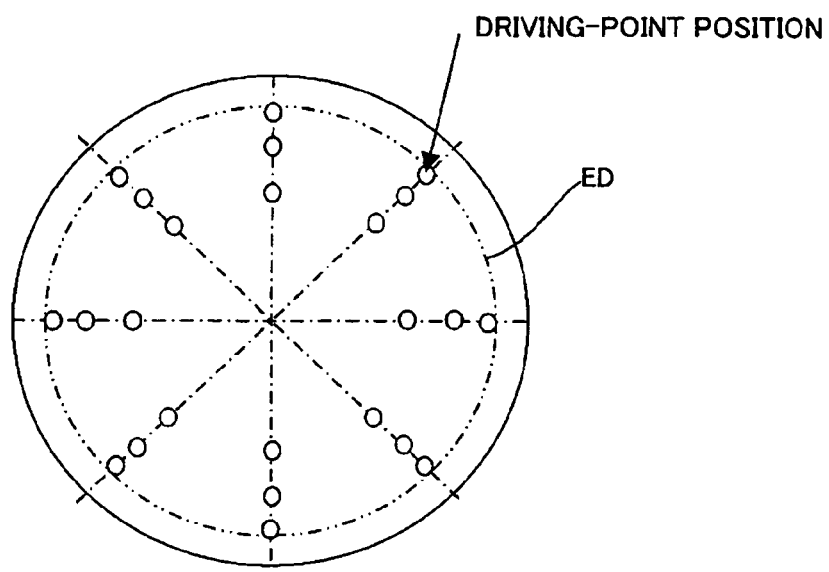
FIG. 3A
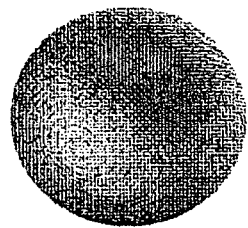 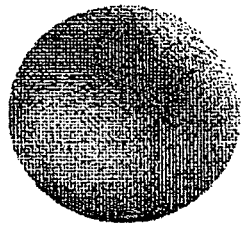
FIG. 3B        FIG. 3C

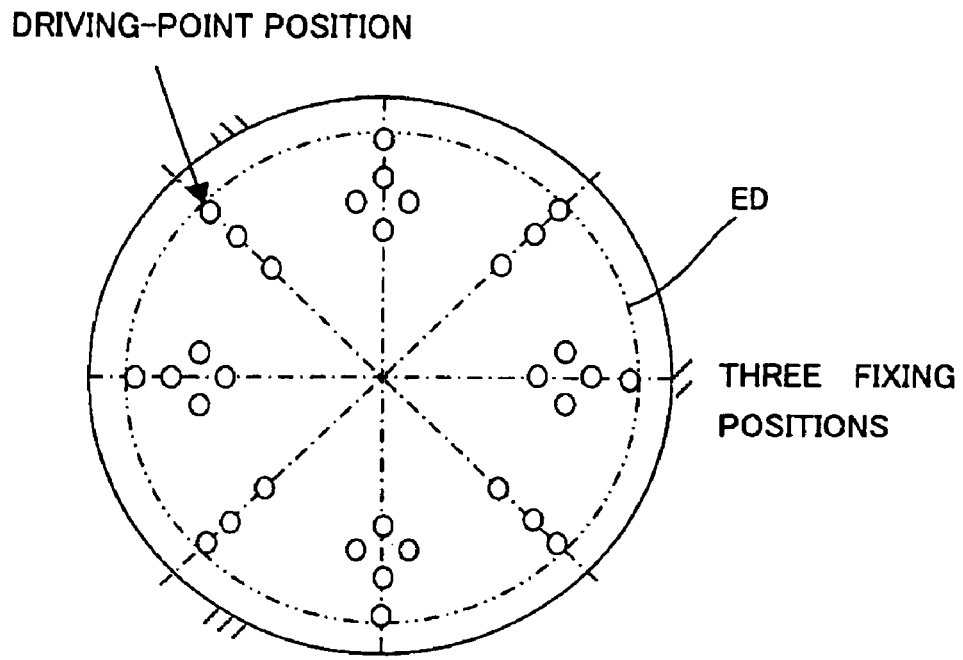
FIG. 5A
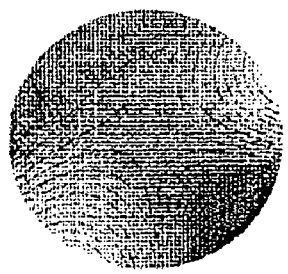 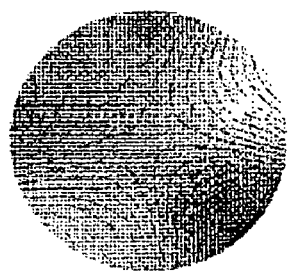
FIG. 5B    FIG. 5C

OPTICAL UNIT AND EXPOSURE APPARATUS HAVING THE SAME

This application claims foreign priority benefit based on Japanese Patent Application No. 2005-116586, filed on Apr. 14, 2005, which is hereby incorporated by reference herein in its entirety as if fully set forth herein.

BACKGROUND OF THE INVENTION

The present invention relates generally to an optical unit and an exposure apparatus having the same, and more particularly, to an optical unit that adjusts the shape of an optical element and an exposure apparatus having the same. This invention is suitable, for example, for an optical unit that adjusts a surface shape of a mirror to correct a wavefront aberration of an optical system including the mirror, as well as an exposure apparatus having such an optical system.

In fabricating a semiconductor device, and the like, by using a photolithography process, a projection exposure apparatus has so far been used that transfers a pattern of a reticle (mask) to a plate. Since such an exposure apparatus is required to precisely transfer a reticle pattern onto a plate, a projection optical system needs to be used that is excellent in imaging performance and well controls aberrations. Due to the recent demand for finer semiconductor devices, a pattern to be transferred has become very susceptible to aberrations of an optical system. For this reason, it is demanded to highly precisely correct wavefront aberration of a projection optical system.

There are two conventional aberration correction approaches—one that adjusts an optical element's surface shape (e.g., see PCT Japanese Publication No. 2003-519404) and the other that changes a position (or posture) of an optical element while maintaining the surface shape of the optical element (e.g., see Japanese Patent Application, Publication No. 2004-064076). PCT Japanese Publication No. 2003-519404 discloses a two-tiered mirror deforming means having actuators connected to the back of a mirror, which correct high-order aberrations, and actuators connected to the actuators via an intermediary deformation plate, which correct low-order aberrations. Japanese Patent Application, Publication No. 2004-064076, discloses a mechanism that uses at least three force actuators to move abreast to an optical axial direction of a mirror or rotate to a direction perpendicular to the optical axis, etc.

PCT Japanese Publication No. 2003-519404 arranges two actuators via an intermediary deformation plate, complicates controls, and results in a large size, due to the two-tier method. Moreover, any asymmetrical aberration causes a moment on the mirror, displacing the mirror's position, but PCT Japanese Publication No. 2003-519404 is silent as to the orientation control. In Japanese Patent Application, Publication No. 2004-064076, actuators act directly on the back surface of the mirror, and the surface shape of a mirror may locally deform during control of the mirror's posture. Any actuator-related part fixed to the back surface of the mirror would deform the mirror due to the weight of the part, but Japanese Patent Application, Publication No. 2004-064076, is silent as to the own-weight compensation.

BRIEF SUMMARY OF THE INVENTION

The present invention is directed to an optical unit that can highly precisely and easily adjust an optical element's posture and surface shape, and an exposure apparatus having the same.

An optical unit according to one aspect of this invention includes a plate having a fixed position, an optical element having a specific optical action, a fixing device for partially fixing the optical element, and a deforming device, located between the plate and the optical element, for applying a deforming force to the optical element to asymmetrically change a surface shape of the optical element.

An optical unit according to another aspect according to this invention includes an optical element having a specific optical action, a deforming device for applying a deforming force to the optical element to change a surface shape of the optical element, and a controller that, when the deforming device applies a deforming force to the optical element, controls the deforming force of the deforming device such that at least part of the optical element is not displaced.

An exposure apparatus including such an optical unit also constitutes an aspect of the present invention. Further, an exposure method as still another aspect of this invention includes the steps of calculating wavefront aberrations of an examined optical system including the optical element, adjusting the examined optical system using the optical unit based on the wavefront aberration of the examined optical system calculated in the calculation step, and exposing a plate using the examined optical system, adjusted in the adjustment step. A device manufacturing method as still another aspect according to the present invention includes the steps of exposing a plate using the exposure apparatus, and developing the exposed plate. A claim for the device manufacturing method that performs the same operation as that of the above exposure apparatus also has an effect on devices as their intermediate and final products. Moreover, such devices include, e.g., semiconductor chips such as LSIs and VLSIs, CCDs, LCDs, magnetic sensors, thin-film magnetic heads, etc.

BRIEF DESCRIPTION OF THE DRAWINGS

FIGS. 3A-3C are views for explaining an effect of the optical unit shown in FIG. 2.

FIGS. 5A-5C are views for explaining an effect of the optical unit shown in FIGS. 4A-4B.

DETAILED DESCRIPTION OF THE PREFERRED EMBODIMENTS

Figure 1:
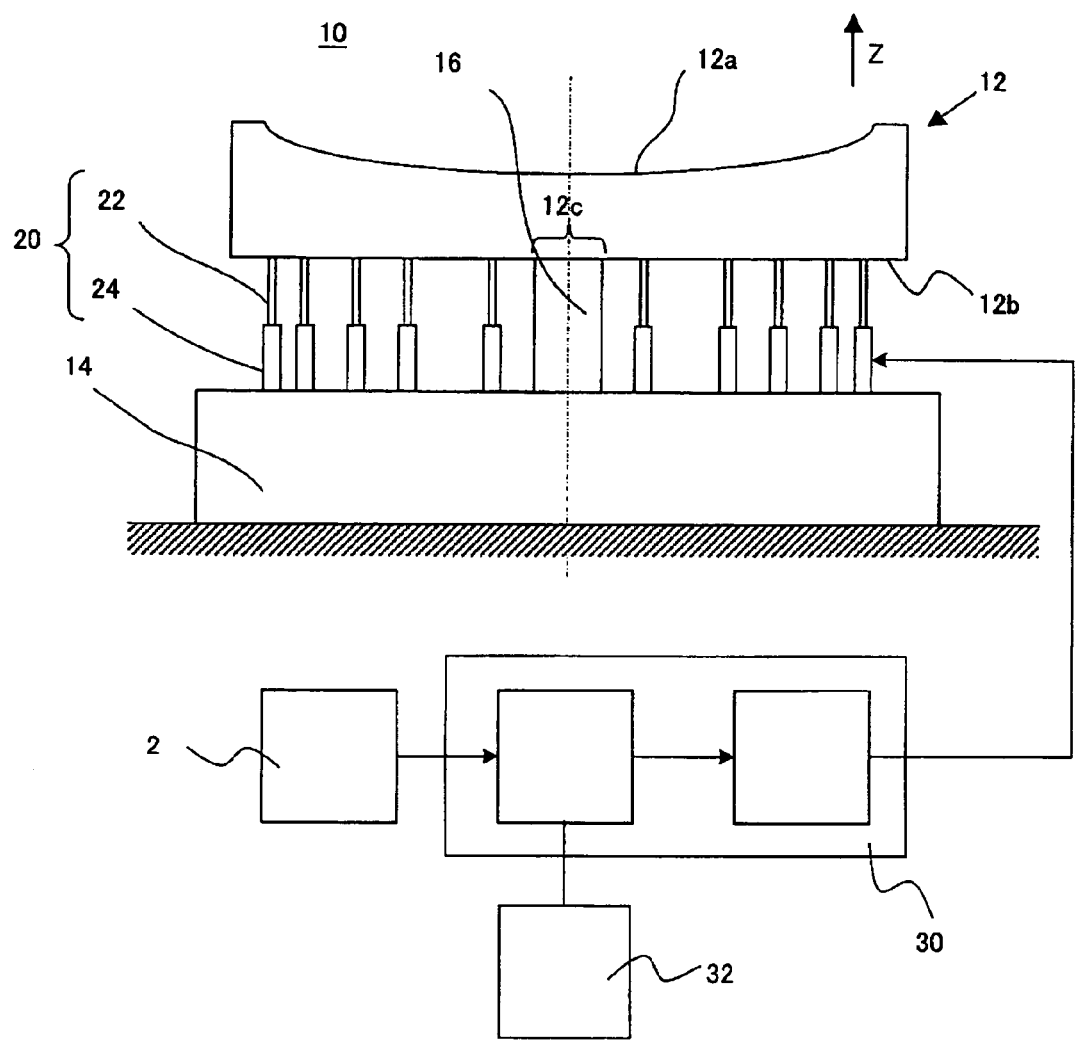
FIG. 1 is a schematic sectional view of an optical unit according to a first embodiment of this invention.

By referring to the accompanying drawings, a description will be given below of an optical unit 10 according to a first embodiment of the present invention, and an exposure apparatus 100 having the same (see FIG. 6). Here, FIG. 1 is a schematic sectional view of the optical unit 10. The optical unit 10 has a mirror 12, a base 14, a fixing means, a deforming means 20, and a controller 30, as well as a function to adjust the planar shape of the mirror 12, and its posture. As described below, the optical unit 10 is part of an optical system that makes up the exposure apparatus 100.

The mirror 12 is an example of an optical element, regardless of whether it is a spherical or an aspheric mirror. It has a reflective surface 12a performing a reflex action and a reverse surface 12b as a backside, opposed to the reflective surface 12a. The reflective surface 12a is irrespective of a convex surface or a concave surface. It is preferable that a low-thermal expansion material such as, e.g., ULE, ZeroDure, a superinver, and the like, be used for the mirror 12 to prevent thermal deformation. The base 14 is a basal plate whose position is fixed within the exposure apparatus 100.

The fixing means is embodied as a support pole 16 in this embodiment, thus fixing the mirror 12 to the base 14 such that, partially, it is not displaced. Since the base 14 is not displaced, a region 12c contacting the support pole 16 of the mirror 12 also becomes unable to be displaced. For the support pole 16, it is desirable to use a highly rigid material with as low-thermal an expansion property as possible. The support pole 16 is provided in the center of the reverse surface 12b of the mirror 12. In this embodiment, the centerline of the support pole 16, the center of the reverse surface 12b (center of gravity), and the center of the base 14 are exemplarily aligned, as shown by a dotted line in FIG. 1. Since the center of gravity of the mirror 12 is on the centerline of the support pole 16, no moment acts on the mirror 12. The present invention sets no limit on the position, shape, size, and number of the fixing means.

The deforming means 20 is composed of multiple pairs of driving rods 22 and actuators 24. The driving rod 22 has one end that is fixable or contactable to the reverse surface 12b of the mirror 12, being driven by the actuator 24, such that it is projected or restored. If the driving rod 22 is fixed to the reverse surface 12b of the mirror 12, the mirror 12 receives a compressive and tensile force from the driving rod 22. If the driving rod 22 merely contacts the reverse surface 12b, the mirror 12 receives only the compressive force from the driving rod 22. The driving rod 22 should preferably be a highly rigid material with as low-thermal an expansion property as possible. The actuator 24 applies a deforming force to the mirror 12 through the driving rod 22. The actuator 24 includes a linear motor, an electromagnet, another force actuator, a piezoelectric element, and another displacement generation actuator.

The controller 30 is connected to the measuring device 101, calculating a deforming force applied by the actuator 24 and the driving amount of the actuator 29. The memory 32 stores information about the current shape of the mirror 12, a relationship between the deformation of the mirror 12 and the deforming force applied by the actuator 24, etc.

In its behavior, the controller 30 acquires information about wavefront aberrations from the measuring device 101, and necessary information, such as a current shape of the mirror 12 from the memory 32, and then, calculates a mirror shape necessary to correct the wavefront aberration, a distribution of a deforming force to be applied by the actuator 24 necessary for forming such a mirror shape, and the driving amount of the actuator 24 needed to form the distribution of such a deforming force. When correcting aberrations, the controller 30 considers, with respect to the actuator 24, a driving force resolving power or a driving displacement resolving power, stability, wavefront aberration measurement precision, a mirror system's rigid matrix precision used to calculate the driving force, etc.

In general, since the distribution of a deforming force for correcting an aberration is asymmetrical, the resultant driving force will never become zero. At this time, the support pole 16 fixes the contact region 12c so that the latter may not be displaced, and thus, the mirror 12 does not move abreast in a Z direction in FIG. 1 or rotate around the axis vertical to the Z direction. For example, although a resultant moment is generated in which the resultant driving force never becomes zero, such a moment is borne by the support pole 16, due to which the mirror 12 does not rotate. As a result, the posture of the mirror 12 can be kept within the required bounds of precision, thus eliminating the need to control the posture of the minor 12. Further, it is needless to say that the optical unit 10 can meet the requirements of the aberration correction having a symmetrical distribution of the deforming force.

According to the present embodiment, since the actuators need not be arranged in a many-tiered way, the structure and control are simple, thus allowing a small apparatus to be maintained. Moreover, no dedicated posture controlling is done, thus eliminating a need for position measurement.

Figure 2:
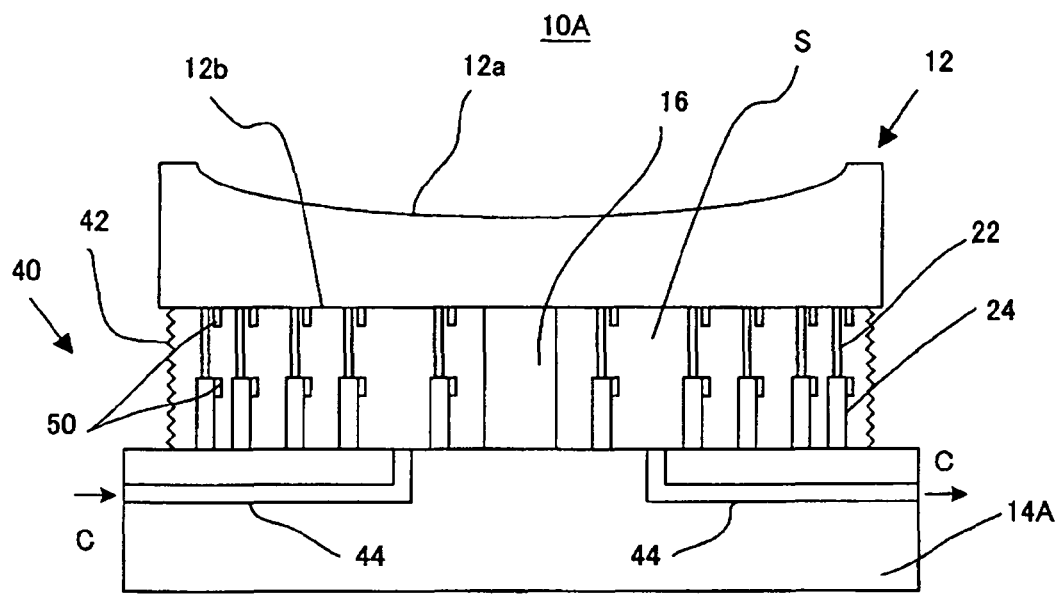
FIG. 2 is a schematic sectional view of an optical unit according to a second embodiment of this invention.

FIG. 2 shows an optical unit 10A according to a second embodiment of this invention. The optical unit 10A is different from the optical unit 10 in that it has a cooling mechanism 40 and an own-weight compensation mechanism 50.

The cooling mechanism 40 cools the actuators 24. Namely, there are those among the actuators 24 that form a temperature distribution in the optical unit 10A due to heat generation. Temperature-adjusting the optical unit 10A as needed enables the mirror 12 to be protected from being thermally deformed, and a thermal effect on exterior materials of the optical unit 10A to be controlled. For example, when the force actuators 24 use a linear motor or an electromagnet, if a force is continuously applied for a set period of time after the mirror 12 is deformed to a desirable shape in order to maintain the shape, heat generation takes place.

The cooling mechanism 40 of this embodiment includes a bellows 42 and a flow path 44. The bellows 42 is provided between the mirror 12 and a base 14A, and forms a space S between the mirror 12 and the base 14A. Even if the driving section 22 moves, the bellows 42 keeps air-tightness of the space S. The flow path 44 is formed in the base 14A, and is in a communicative connection with the closed space S. A coolant C circulates in the flow path 44. The coolant C is supplied from a supply section (not shown) via piping and a flow rate adjustment meter, and is exhausted to a collecting section (not shown). The circulation of the coolant C through the space S makes the actuators 24 cool off. The coolant C is temperature-adjusted air, and the like.

In another embodiment, a cooling jacket is located in which a coolant circulates in each of the actuators 24. This can effectively cool off the actuators 24, especially those that heat up. Further, cooling each actuator 24 and circulating a cooling gas to the space S may be simultaneously performed.

The own-weight compensation mechanism 50 has the function of protecting the deformation of the mirror 12 due to its own weight or by forces (hereinafter, simply called "deformation by the own-weight"), other than the deforming force from the actuators 24. In other words, the mirror 12 is deformed by its own weight, and further, it is also deformed by installing the driving rods 22. Thus, this embodiment provides the own-weight compensation mechanism 50, canceling deformation due to the own-weight of the mirror 12. The own-weight compensation mechanism 50 of this embodiment is embodied by magnets located such that the same polarity is opposed. Each magnet is fixed at the mirror's reverse surface 12b and at each actuator 24. The magnetic force of a magnet may be made up such that it is adjustable. In this way, by eliminating the effect of the mirror own-weight deformation, the actuators 24 are made to generate only the force for deforming the mirror shape, thus relatively controlling heat generation.

When a surface of the mirror is processed, such own-weight deformation should be considered, and the processing may be done so as to compensate for the own-weight deformation, and to obtain a desirable initial mirror shape after the own-weight deformation.

In the optical unit 10A, the support rods 22 are fixed at the reverse surface of the mirror 12, and as shown by circles in FIG. 3A, a total of twenty-four points are arranged, with three points in a radial direction and eight points in a circumferential direction at forty-five degree intervals. A two-dot dashed curve ED in FIG. 3A is an effective diameter of the mirror 12. When a target shape of the reflective surface 12a inside the effective diameter ED shown in FIG. 3B is set up in the arrangement shown in FIG. 3A, a simulation result obtained by driving the driving rods 22 to deform the reflective surface 12a is shown in FIG. 3C. As shown in FIG. 3C, the reflective surface 12a has a surface shape close to the target shape shown in FIG. 3B. Incidentally, the arrangement shown in FIG. 3A is just an example, and an arrangement of the driving rods 22 is decided according to a target surface shape of a mirror needed.

Figure 4A:
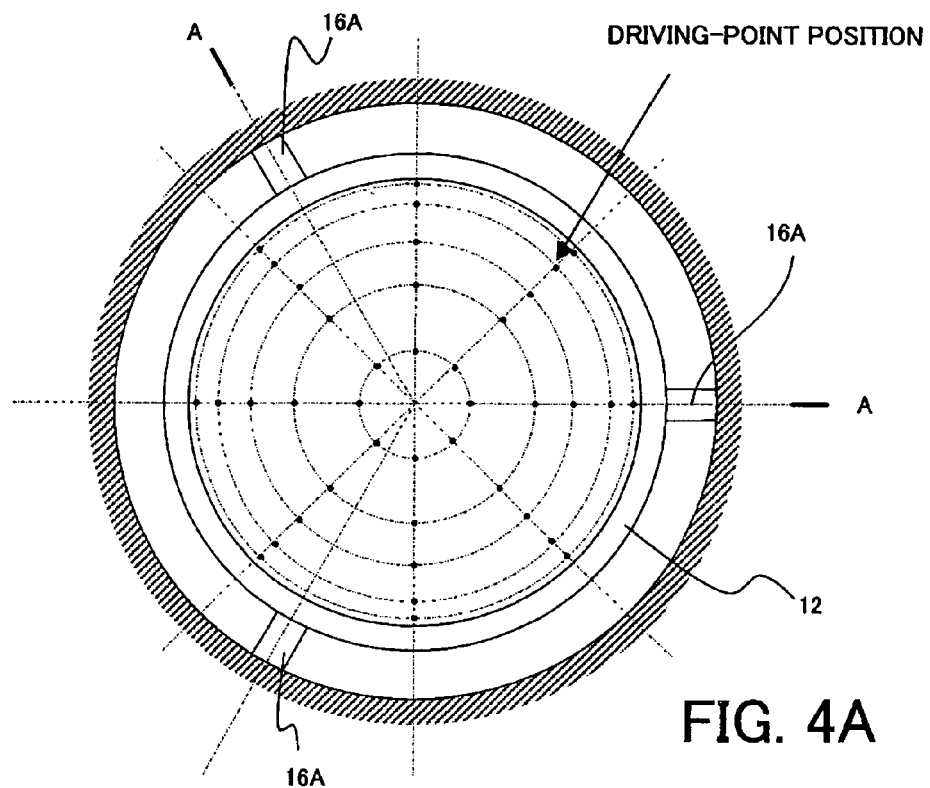
FIGS. 4A-4B are schematic sectional views of an optical unit according to a third embodiment of this invention.
Figure 4B:
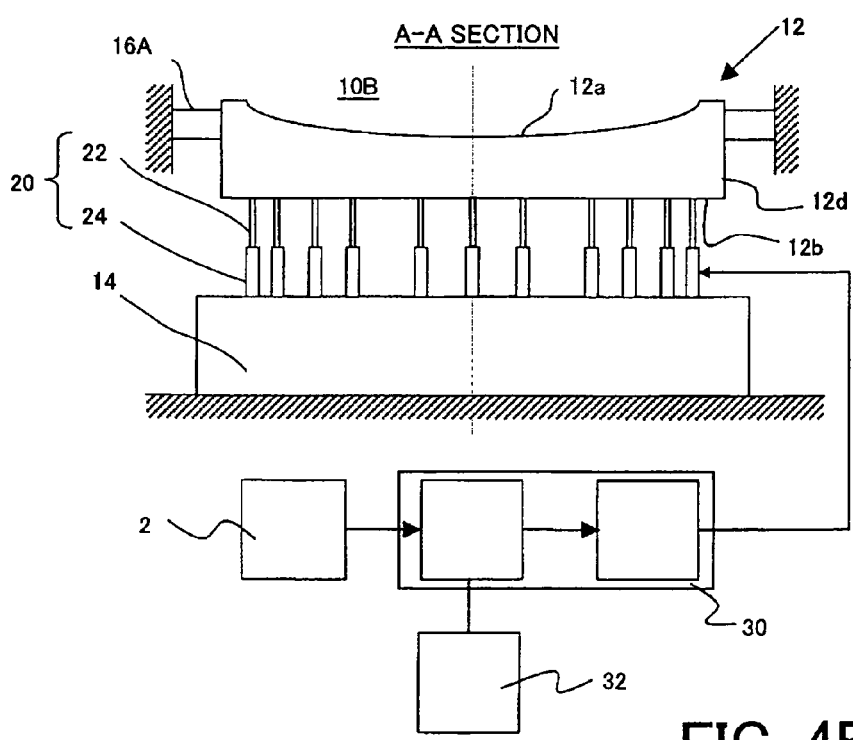

Now, by referring to FIG. 4A and FIG. 4B, a description will be given of an optical unit 10B according to a third embodiment of this invention. Here, FIG. 4A is a top surface view of the optical unit 10B, and FIG. 4B is an A-A sectional view of FIG. 4A. The optical unit 10B is different from the optical unit 10 in the fixing means. The fixing means of the optical unit 10B has fixing plates 16A, in place of the support pole 16, that are fixed to the side surface 12d of the mirror 12, at least at three or more points. The optical unit 10B has the advantage that the eigenfrequency of the mirror 12 can be made higher than that of the optical unit 10. Dark dots in FIG. 4A denote driving points showing driving positions. In the optical unit 10B, the driving rods 22 are fixed to the reverse surface 12b of the mirror 12, and a total of thirty-two points are arranged, as shown in FIG. 5A. A two-dot dashed curve ED in FIG. 5A is the effective diameter of the mirror 12. When a target shape of the reflective surface 12a inside the effective diameter ED shown in FIG. 5B is set up in the arrangement shown in FIG. 5A, a simulation result obtained by driving the driving rod 22 to deform the reflective surface 12a is shown in FIG. 5C. As shown in FIG. 5C, the reflective surface 12a has a surface shape close to the target shape shown in FIG. 5B. Incidentally, the arrangement shown in FIG. 5A is just an example, and an arrangement of the driving rods 22 is decided according to a target surface shape of a mirror needed.

It goes without saying that the cooling mechanism 40 and the own-weight compensation mechanism 50 can be applied to the optical unit 10B.

As described above, if the optical unit 10 or 10B is used, an aberration can be corrected by applying an asymmetrical deforming force to the mirror 12, and further, by properly selecting an arrangement of the mirror driving points, it becomes possible to correct low-order to high-order aberrations. In addition, this realizes a small apparatus with a simple structure.

Figure 16:
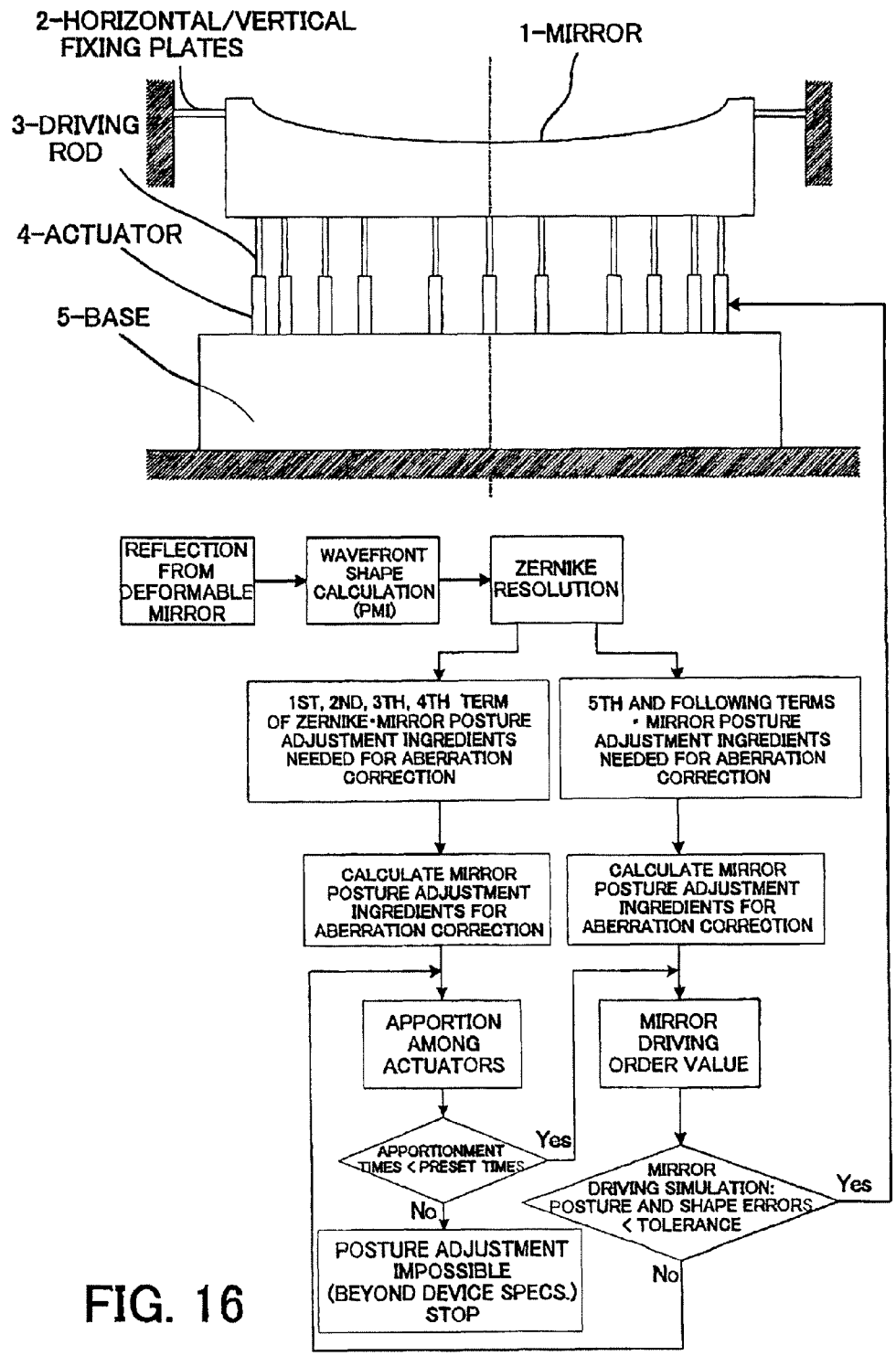
FIG. 16 is a schematic sectional view of an optical unit of a fourth embodiment of this invention.

FIG. 16 shows a fourth embodiment of this invention. The mirror 1 is fixed using at least three fixing plates 2 that abridge horizontal and vertical freedom. One end of a driving rod 3 to change the shape of the mirror 1 is connected to the backside of the mirror 1, and the other end of the driving rod 3 is connected to the actuator 4. The actuators 4 are located on the base 5.

The algorithm for deforming the mirror 1 is as follows. Reflective light from the mirror 1 is measured by a wavefront shape measurement instrument (PMI), and the resultant wavefront shape is Zernike-resolved. Each of first, second, third, and fourth terms of the Zernike formula is an amount about the mirror's vertical shift and an amount about its horizontal tilt, showing a change of the mirror's posture, and these are amounts required to adjust the mirror's posture. A fifth and following terms of the Zernike formula are shape ingredients of the mirror necessary for correcting aberrations on the optical system. A driving force needed for adjusting the mirror's posture is calculated, the driving force is apportioned among the actuators 4 that deform the shape of the mirror, and a mirror deformation driving order value is calculated for the actuators 4 together with the driving force needed for the mirror shape deformation. Based on this driving order value, a mirror deformation simulation is implemented to determine whether the posture of the mirror 1 and shape errors are within tolerable values, and if it is found to be below the tolerance, the driving order value is sent to the actuators 4 to deform the shape of the mirror 1 to a shape necessary for aberration correction.

A judgement is made to see if the posture of the mirror 1 and shape errors are within tolerable values, and if they are found to be beyond the tolerance, a mirror shape deformation simulation is performed by changing the rate with which to apportion among the actuators the driving force needed for adjustment of the posture of the mirror. This is iterated, and when the number of iterations is over a preset number, an amount of the posture adjustment will result in being beyond the specifications of the unit, thus being unable to be adjusted.

As a method to apportion a mirror posture adjustment driving force among the actuators, an objective function can be set such that after driving the mirror's deformation, the amount of posture changes and the mirror's shape errors become minimum, thus performing optimization. Further, optimization may be performed using a genetic algorithm.

By use of the above-mentioned method, a shape of the mirror can be controlled such that at least part of an optical element may not be displaced or is displaced within the bounds of tolerance, thus maintaining the mirror's posture, and recovering the mirror's post-deformation shape errors within its tolerance.

Now, referencing FIGS. 6 to 13, a description will be given of the exposure apparatus 100. Here, FIG. 6 is a schematic block diagram of the exposure apparatus 100. The exposure apparatus 100 is a projection exposure apparatus that uses, e.g., a step-and-scan method or a step-and-repeat method to expose a circuit pattern formed on a mask 152 onto an exposed object (plate) 172. Such an exposure apparatus is suitably applicable to a photolithography process of a submicron or a quarter-micron or less, and a description will be given below of a step-and-scan exposure apparatus (which is also referred to as a "scanner") as an example.

The exposure apparatus 100 has a measuring device 101, and includes an illumination apparatus, an alignment optical system 120, a mask 152, a projection optical system 160, and a plate 172.

The illumination apparatus illuminates the mask 152, having a light source section 105 and illumination optical systems (110 and 112). The light source section 105 can use as a light source, e.g., an ArF excimer laser with a wavelength of approximately 193 nm, a KrF excimer laser with a wavelength of approximately 248 nm, and the like. However, the kind of laser is not limited to an excimer laser, and an $F_2$ laser with a wavelength of about 157 nm and extreme ultraviolet (EUV) light with a wavelength of 20 nm or less (e.g., about 13.5 nm) can also be used.

The illumination optical system is an optical system that illuminates the mask 152, including a lens, a mirror, an optical integrator, a stop, etc. The illumination optical system of this preferred embodiment has a deflecting optical system 110 and a first illumination optical system 112. The deflecting optical system 110 deflects a beam of light from the light source section 105, and guides it to first and second illumination optical systems 112 and 120. The first illumination optical system 112 is an optical system that illuminates the mask 152, arranging such optical elements as, e.g., a condenser lens, a fly-eye lens, an aperture stop, a condenser lens, a slit, and an imaging optical system, in this order. In an optical system that utilizes EUV, all the illumination optical systems are composed only of mirrors.

The alignment optical system 120 doubles as the function of illuminating masks (first and second masks 142 and 180 to be described later) that are used by the measuring device 101, and so, it may also be called as a second illumination optical system in this specification. The alignment optical system 120 makes up an alignment scope as well as making up part of the measuring device 101 as described later. During ordinary exposure, the second illumination optical system 120 is located outside the light path, and FIG. 1 does not include the driving mechanism that drives the alignment illumination optical system 120. The alignment scope illuminates an alignment mark (not shown) on the mask 152 and compares its reflected light and the reference mark. Further, the alignment mark on a wafer stage 170 is image-formed via the projection optical system 160, thus aligning the wafer stage 170.

The mask (or reticle) 152 has a circuit pattern (or an image) formed so as to be transferred, and is supported and driven by the mask stage (or reticle stage) 150. Diffracted light emitted from the mask 152 goes through the projection optical system 160 to be projected onto the plate 172. The mask 152 and the plate 172 are optically in a conjugate relationship. Since the exposure apparatus 100 of this embodiment is a scanner, the mask 152 and the plate 172 are scanned at the speed ratio of the reduction ratio to transfer the pattern on the mask 152 onto the plate 172. On the other hand, if a step-and-repeat type exposure apparatus (also called a "stepper") is used, the exposure operation is carried out with the mask 152 and the plate 172 in a standing-still state. When EUV light is utilized, a reflection type reticle will be used.

The projection optical system 160 may use an optical system solely composed of a plurality of lens elements, an optical system comprised of a plurality of lens elements and at least one concave mirror (a catadioptric optical system), a full mirror type catoptric system, and so on. Any necessary correction of the chromatic aberration may use a plurality of lens units made from glass materials having different dispersion values (Abbe values), or arrange a diffractive optical element, such that it disperses in a direction opposite to that of the lens unit. The measuring device 101 evaluates the optical performance (e.g., wavefront aberrations) of this projection optical system 160. The projection optical system 160 of this embodiment is a catadioptric or a catoptric optical system, and includes a mirror. For such a mirror, the mirror of the optical devices 10 to 10C can be applied. When EUV is utilized, the inside of the exposure apparatus 100 is evacuated, but for the gas of the cooling mechanism 40, gas piping is set up so as not to damage the vacuum atmosphere.

The plate 172 is a processed object, such as a wafer, a liquid crystal plate, and the like, and a photo-resist is applied to it. The plate 172 is installed onto the stage 170 via a chuck (not shown). The stage 170 supports the plate 172 and part of the measuring device 101. The stage 170 may use any structure known in the art, and thus, a detailed description of its structure and operations is omitted here. For example, the stage 170 uses a linear motor to move the plate 172 and part of the measuring device 101 in X-Y directions. The mask 152 and plate 172 are, for example, scanned synchronously, and the positions of the stage 170 and mask stage 150 are monitored by using the second illumination optical system 120 so that both are driven at a constant speed ratio.

The measuring device 101 shown in FIG. 1 has the alignment optical system (the second illumination optical system) 120, the first mask 142, the beam splitting means 146, the second mask 180, the image pick-up means 186, a communication cable 188, a controller 190, and a memory 192. In this embodiment, the measuring device 101 includes an interferometer that evaluates the optical performance of the projection optical system 160 as an examined optical system by detecting its interference fringe. As an interferometer, a line diffraction interferometer (LDI) is used here. However, other interferometers, such as a point diffraction interferometer (PDI) or a lateral shearing interferometer (LSI) may be used instead for the measuring device 101.

Figure 7:
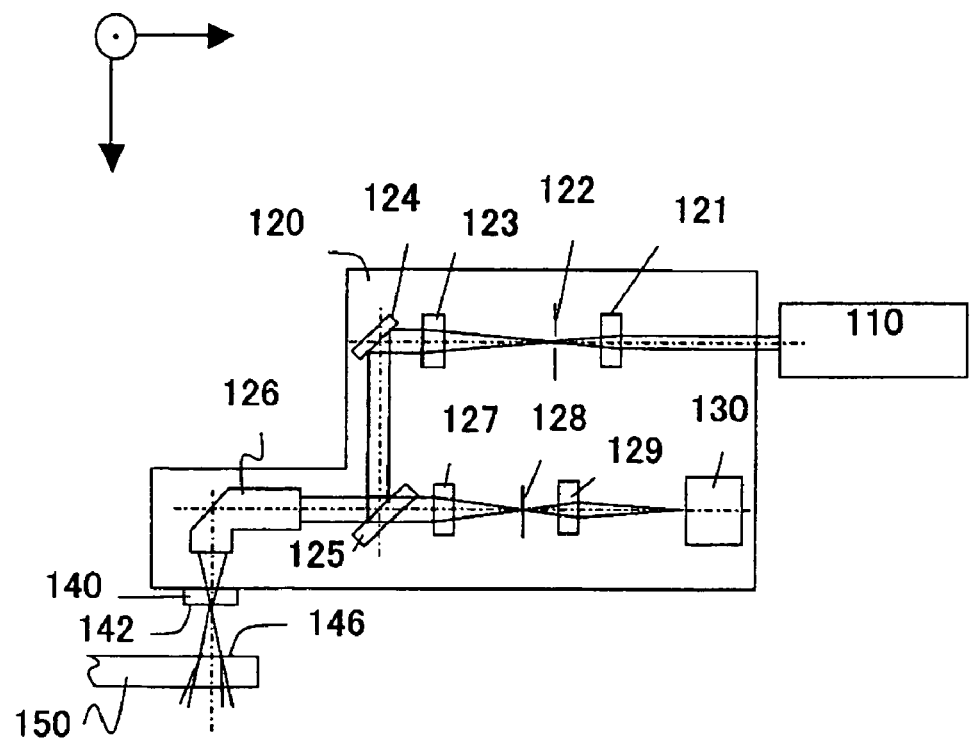
FIG. 7 is a view of an optical path including a second illumination optical system, a beam splitting means, and a first mask of a measuring device applicable to the exposure apparatus shown in FIG. 6.

As shown in FIG. 7, the second illumination optical system 120 has illuminating optical systems 121 and 123, an illumination optical system field stop 122, a deflection mirror 124, and a half mirror 125. Further, the second illumination optical system 120 also has a condenser lens 126, optical systems 127 and 129 for imaging systems, a reference mark 128, and an imaging means 130. Here, FIG. 7 is a light path diagram that includes the second illumination optical system 120 of the measuring device 101, first mask 142 and beam splitting means 146.

The optical system 121 is a condenser optical system that condenses light to the field stop 122, and the optical system 123 is a collimator that converts the beam exiting from the field stop 122 into parallel light. The deflection mirror 124 and the half mirror 125 deflect the beam from the optical system 124, and the condenser lens 126 condenses light to the first mask 142. Light supplied from the light source section 105 via the deflecting optical system 110 goes through the optical elements 121 to 126, being projected to the projection optical system 160. The optical elements 125 through 130 function as an alignment scope for the mask stage 150 and the wafer stage 170, and so, the condenser lens 126 functions as an objective lens for alignment of the mask pattern and plate 172.

Figure 8:
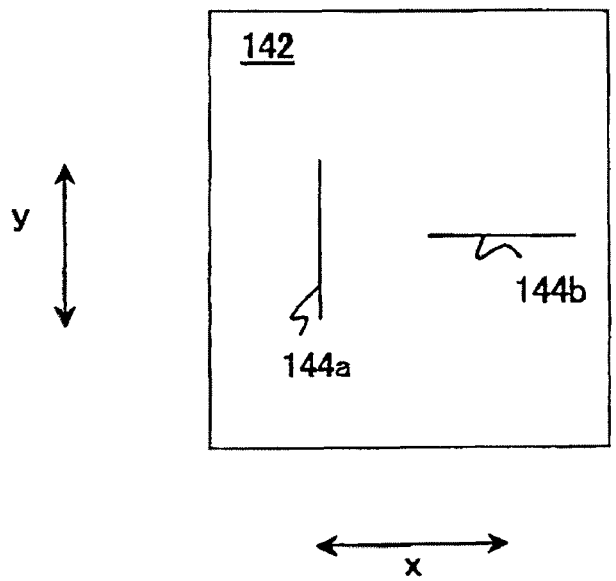
FIG. 8 is a schematic plan view of the first mask shown in FIG. 7.

The first mask 142 is installed on the second illumination optical system 120 via the plate 140, having a pair of slits 144a and 144b, as shown in FIG. 8. Here, FIG. 8 is a schematic block diagram of the first mask 142. The first mask 142 is composed of two kinds of slits 144a and 144b arranged at ninety degrees. The slits 144a and 144b are the same in width and length, but different only in direction.

As described later, the condenser lens 126 can illuminate only the slits 144a or 144b. For this objective, the first mask 142 may be installed in a movable way with respect to the illumination optical system 120 via a driving mechanism (not shown), or the driving mechanism may be provided on the side of the illumination optical system 120.

In this embodiment, the direction in which the slit 144a extends may be called a y-direction, and the direction in which the slit 144b extends may be called an x-direction. Further, in this embodiment, the slit 144a may be called a zero-degree direction slit, and the slit 144b a ninety-degree direction slit. The width Δr of the slits 144a and 144b is a width equal to or less than a diffraction limit determined by the following formula, assuming that the numerical aperture at the reticle side of the projection optical system 160, i.e., the object side is ANo, and the exposure wavelength is λ, $$\Delta r < 0.5 \cdot \lambda / ANo \qquad (1)$$

By determining the width of the slit, as shown by the mathematical expression (1), diffracted light from the slit can be regarded to be an equiphase. The length Lr is longer the better from the standpoint of the light amount, but it should be made smaller than the so-called "isoplanatic region" that an aberration of the projection optical system 7 can be regarded as the same.

The beam splitting means 146 amplitude-splits a beam diffracted from the slits 144a and 144b. The beam splitting means 146 is structured as a grating, e.g., having the structure shown in FIG. 9. The beam splitting means 146 is set up on a transparent plate (not shown) located on the mask stage 150. Alternatively, a plate (not shown), on which a diffraction grating is arranged, may be prepared such that it is mounted on the mask stage 150 instead of the mask 152.

Figure 9:
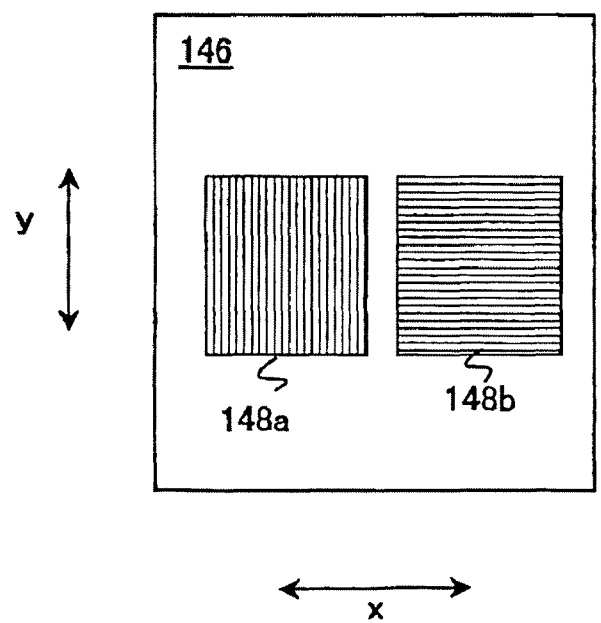
FIG. 9 is a schematic plan view of the beam splitting means shown in FIG. 7.

In FIG. 9, the beam splitting means 146 is an amplitude type diffraction grating. When the slit 144a, which is long in the y-direction, is used for measurement, a diffraction grating is used in which lines are arranged in the x-direction, as with the diffraction grating 148a in FIG. 9. Due to the diffraction grating 148a, a beam is split in the x-direction in the figure. Multiple split beams are image-formed onto the second mask 180 via the projection optical system 160. The diffraction gratings 148a and 148b are driven by the driving mechanism of the mask stage 150 where the beam splitting means 146 is installed.

Figure 10:
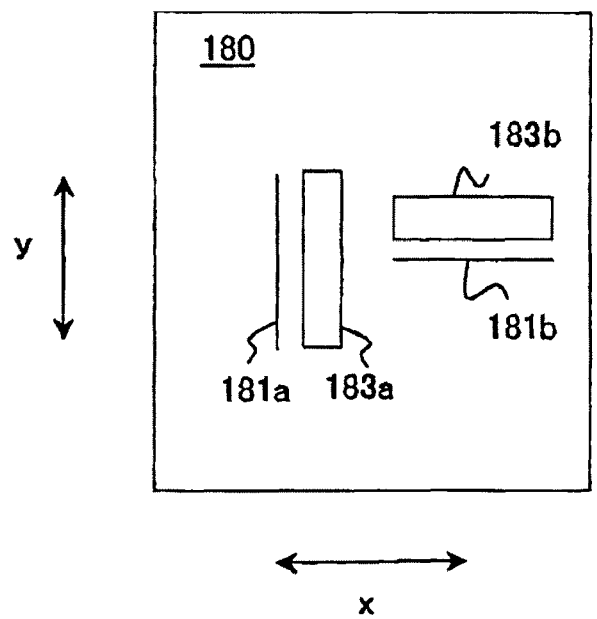
FIG. 10 is a schematic plan view of the second mask shown in FIG. 7.

As shown in FIG. 10, the second mask 180 includes a pair of the slit 181a and the window 183a located in a zero-degree direction (y-direction), and a pair of the slit 181b and the window 183b located in the ninety-degree direction (x-direction). The pair of the slit 181a and the window 183a, and the pair of the slit 181b and the window 183b have the same width and interval, but different directions. The width Δw of the slits 181a and 181b is a width that is equal to or less than the diffraction limit determined by the following formula, assuming that the numerical aperture at the wafer side of the projection optical system 160, i.e., the image side is NAi:

$$\Delta w < 0.5 \cdot \lambda / NAi. \qquad (2)$$

By determining the width of the slits 181a and 181b as with the mathematical expression 2, light diffracted from the slits 181a and 181b can be regarded to be an equiphase within the range of Nai.

The width Δw' of the windows 183a and 183b is determined by a spatial frequency of the projection optical system to be measured. When desiring to measure as far as a radio-frequency wave, make the width wide, and when only a low-frequency wave is measured, make it narrow. If the spatial frequency of the pupil of the projection optical system 160 is f, Δw can be given by the following equation. Here, it is assumed that the frequency f of the wavefront aberration is one where the pupil's radius forms one cycle.

$$\Delta w' = 2 \times f \times \lambda / NAi \qquad (3)$$

The length Lw is the longer, the better from the standpoint of the light amount, but it should be made smaller than the so-called isoplanatic region that is regarded to be the same by the aberration of the projection optical system 160.

The image pick-up means 186 is composed of a CCD, and the like, detecting an interference fringe of two beams from the slit 181a or 181b and the window 183a or 183b. The cable 188 connects the image pick-up means 186 and the controller 190 so that they can communicate. The controller 190 obtains phase information from the output of the image pick-up means 186. Further, it controls each part of the exposure apparatus 100. The memory 192 stores the measurement method shown in FIG. 8 as explained later, the processing method for the controller 190 to obtain phase information from the output of the image pick-up means 186, phase information that the controller obtains, the controlling method for the controller 190 to perform, and other data. The controller 190 may double as the controller 30, and the memory 192 may double as the memory 32.

Figure 13:
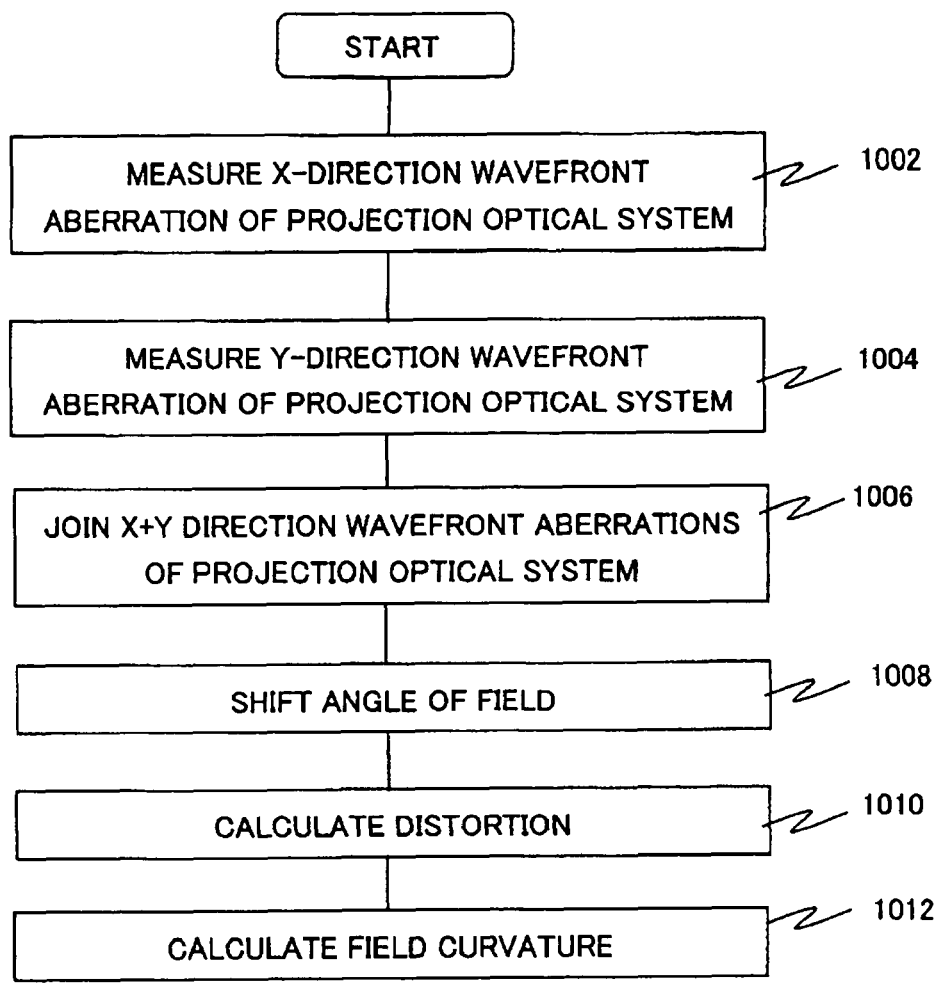
FIG. 13 is a flowchart for explaining an operation of the measuring device shown in FIG. 1.

Referring to FIG. 13, a description will be given of the operation of the measuring device 101. Here, FIG. 13 is a flowchart for explaining how the measuring device 101 operates. At first, an x-direction wavefront aberration of the projection optical system 160 is measured (Step 1002).

Figure 6:
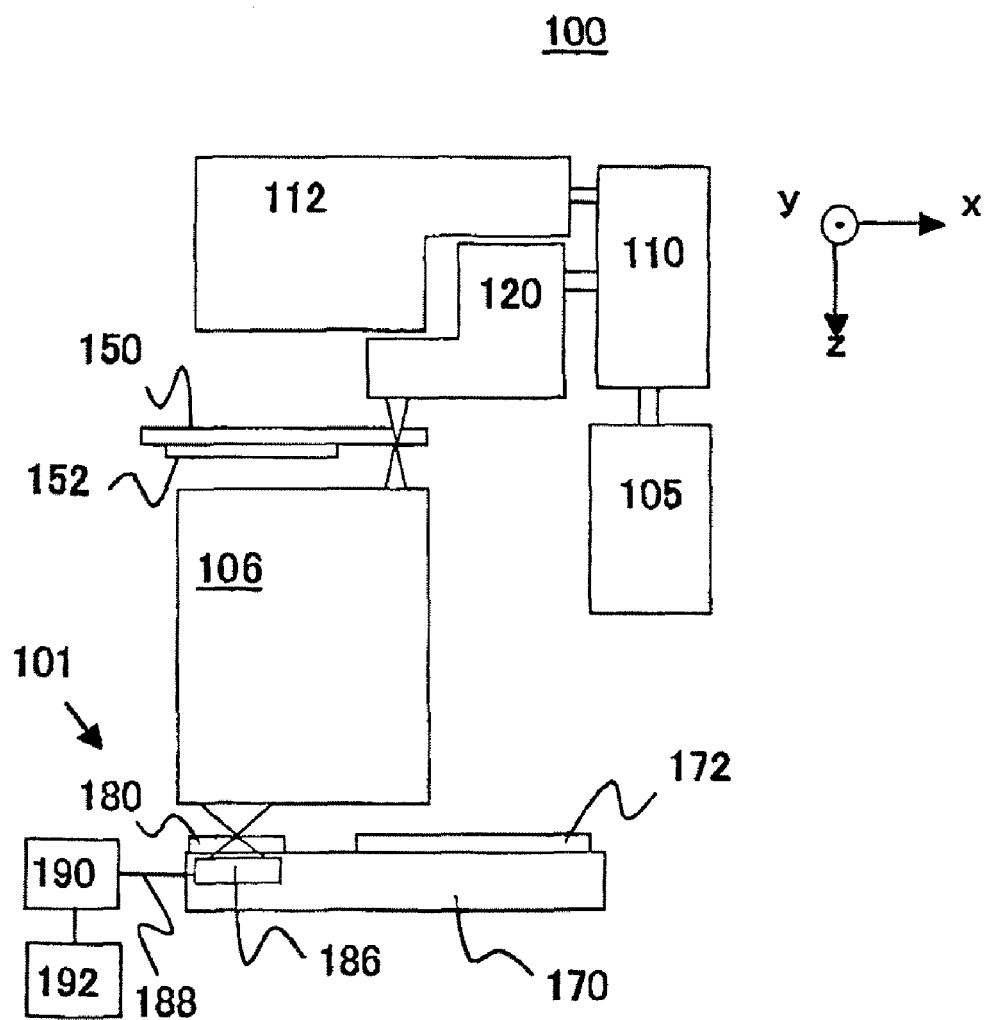
FIG. 6 is a schematic block diagram of an exposure apparatus as an embodiment of this invention.

In FIG. 6, a beam exiting from the light source section 105 is deflected by the deflecting optical system 110 to the second illumination optical system 120 for imaging performance measurement. The beam from the deflecting optical system 110 is condensed by the illumination optical system optical system 121, being irradiated to the field stop 122. The field stop 122 is made so large as to irradiate the first mask 142 arranged onto the plate 140. The beam from the field stop 122 is turned into parallel light by the optical system 123, is deflected by the deflection mirror 124 and the half mirror 125, and is made incident on the condenser lens 126. The condenser lens 126 condenses light into the first mask 142.

In Step 1002, a driving mechanism (not shown) relatively moves the illumination optical system 120 and the mask 142 to ensure that the beam from the condenser lens 126 is irradiated only to the zero-degree direction slit 144a.

Since the slit 144a has a width equal to or less than the diffraction limit, light exiting from the slit 144a becomes diffracted light having an equiphase wavefront with respect to the x-direction in the figure. On the other hand, diffraction of light in the y-direction or longitudinal direction of the slit 144a is small. Accordingly, at least with respect to the y-direction in FIG. 8, a beam with a numerical aperture equal to or greater than the numerical aperture on the object side of the projection optical system 160, i.e., reticle side, is irradiated to the slit 144a through the condenser lens 126. By so doing, the whole surface of the optical pupil of the projection optical system 160 will be irradiated by light. Moreover, light diffracted in a short direction of the slit 144a will become an equiphase.

The beam is diffracted at the slit 144a, is turned into an x-direction equiphase wavefront, and undergoes an amplitude division in the x-direction through the diffraction grating of the beam splitting means 146. Multiple beams that underwent the amplitude division are image-formed onto the second mask 180 via the projection optical system 160. In other words, of those beams diffracted at the slit 144*a* and diffracted at the diffraction grating 148*a*, a zero-order beam is image-formed at the slit 181*a* of the beam splitting means 180, and a first-order beam is image-formed at the window 183*a*. The pitch of the diffraction grating 148*a* is set in that way, and the position of the beam splitting means 180 is set by the mask stage 150 accordingly. Other diffracted lights are shielded by the shielding parts of the mask 180. A negative first order beam may be used in lieu of the plus first-order beam.

Figure 11:
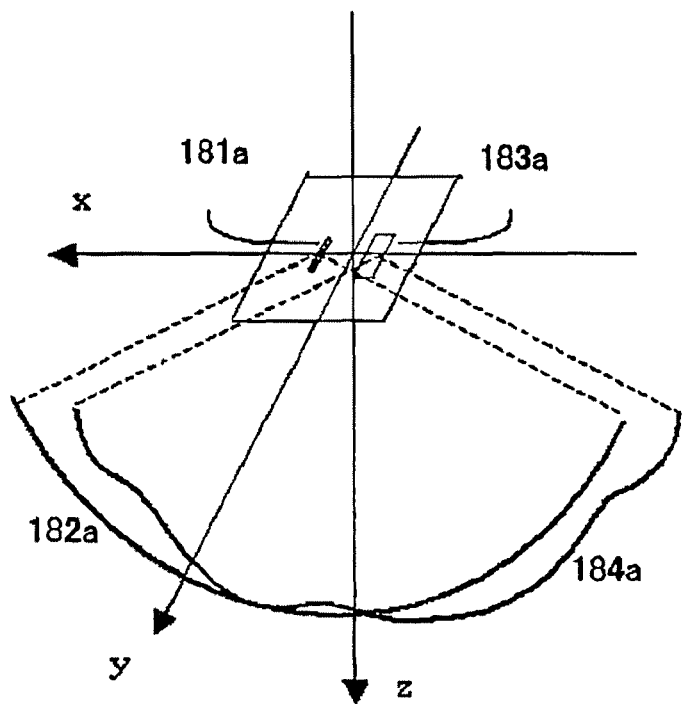
FIG. 11 is a typical view of a beam exiting from the center of a slit and a window for the second mask shown in FIG. 10.

The beam having passed the window 183*a* is affected by the wavefront aberration of the projection optical system 160. On the other hand, since the slit 181*a* has a width equal to or less than the diffraction limit, light exiting from the slit 181*a* spreads in the x-direction in the figure, becoming diffracted light having an equiphase wave, which has lost wavefront aberration information of the projection optical system 160. FIG. 11 shows a typical view of light emitted from the center of the slit 181*a* and the window 183*a*. It can be understood that light going through the slit 181*a* forms an ideal cylindrical wavefront 182*a* or an ideal elliptical wavefront 182*a*, and light having gone through the window 183*a* is an examined wavefront 184*a*.

Figure 12:
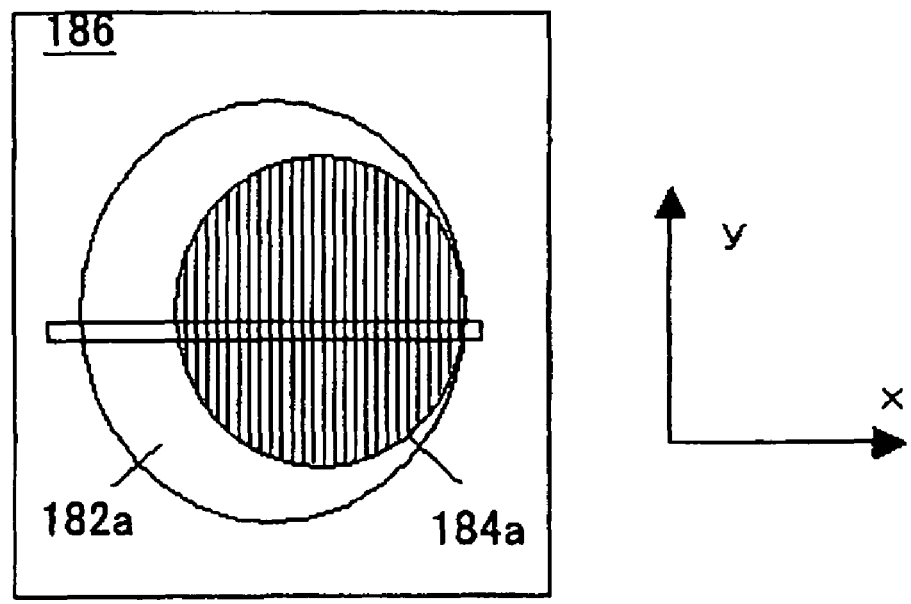
FIG. 12 is a schematic plan view showing an example of an interference fringe of a beam exiting from the slit and window shown in FIG. 10, which the image-pickup means shown in FIG. 7 detects.

FIG. 12 shows an example of an interference fringe made by the lights exiting from the center of the slit 181*a* and the window 183*a*, which are detected by the image pick-up means 186. Two pupil images of the projection optical systems 160 are taken whose centers are off by the interval between the slit 181*a* and the window 183, and an interference fringe comes into being in the area common to both. The x-direction of the beam 182*a* is an equiphase, and thus, if phase information is taken out of the interference fringe in FIG. 12, an x-direction wavefront aberration of the projection optical system 160 can be found. For acquisition of the phase information, the so-called fringe scan method is used. In the fringe scan method, while the mask stage 150 is scanning the diffraction grating 148*a* by about one pitch in a direction vertical to the line of the diffraction grating, namely, in an x-direction, the image pick-up means 186 takes several images of an interference fringe.

Several images taken of the interference fringe are sent from the image pick-up means 186 to the controller 190 via the cable 188, and the controller 190 takes out phase information. When the controller 190 acquires the phase information, e.g., an electronic moiré method may be used. In this embodiment, since an interference fringe has a carrier fringe as shown in FIG. 7, the imaged interference fringe is multiplied by the carrier fringe that the controller 190 prepares or has prepared beforehand and stored in the memory 192, thus being processed. If an electronic moiré method is used, phase information can be taken out of one picture of the interference fringe, which is advantageous in terms of time.

Next, a y-direction wavefront aberration of the projection optical system 160 is measured (Step 1004). Similar to Step 1002, the condenser lens 126 condenses light to the first mask 142. At this time, in Step 1004, the driving mechanism (not shown) moves the illumination optical system 120 and the mask 142 relatively, ensuring that the beam from the condenser lens 126 is irradiated only to the ninety-degree direction slit 144*b*.

Since the slit 144*b* has a width equal to or less than the diffraction limit, light exiting from the slit 144*b* spreads in the y-direction in the figure, and becomes diffracted light having an equiphase wavefront with respect to the y-direction. On the other hand, diffraction of light in the x-direction or longitudinal direction of the slit 144*b* is small. Accordingly, at least with respect to the x-direction in FIGS. 3A-3C, a beam with a numerical aperture equal to or greater than the numerical aperture on the projection optical system 160's object side, i.e., reticle side, is irradiated to the slit 144*a* by using the condenser lens 126. This will permit light to be irradiated across the whole optical pupil surface of the projection optical system 160. Moreover, light diffracted in a short direction of the slit 144*b* will become equiphase.

The beam is diffracted at the slit 144*a*, is turned into a y-direction equiphase wavefront, and undergoes the amplitude division in the y-direction through the diffraction grating of the beam splitting means 146. Multiple beams that underwent the amplitude division are image-formed onto the second mask 180 via the projection optical system 160. In other words, of those beams diffracted at the slit 144*b* and diffracted at the diffraction grating 148*b*, a zero-order beam is image-formed at the slit 181*b* of the beam splitting means 180, and a plus first-order beam is image-formed at the window 183*b*. The pitch of the diffraction grating 148*b* is set in that way, and the position of the beam splitting means 180 is set by the mask stage 150 accordingly. Other diffracted lights are shielded by the shielding parts of the mask 180. A negative first-order beam may be used instead of the plus first-order beam.

The beam having passed the window 183*b* is affected by the wavefront aberration of the projection optical system 160. On the other hand, since the slit 181*b* has a width equal to or less than the diffraction limit, light exiting from the slit 181*b* spreads in the y-direction in the figure, and becomes diffracted light having, with respect to the y-direction, an equiphase wavefront and no more information about wavefront aberrations of the projection optical system 160. For acquisition of the phase of the interference fringe, the fringe scan method is used similarly to that in Step 1002. In the fringe scan method, while the mask stage 150 is scanning the diffraction grating 148*b* by about one pitch in a direction vertical to the line of the diffraction grating, namely, in an x-direction, the image pick-up means 186 takes several images of an interference fringe.

Several images taken of the interference fringe are sent from the image pick-up means 186 to the controller 190 via the cable 188, and the controller 190 acquires phase information. When the controller acquires the phase information, an electronic moiré method, e.g., may be used. Since the wavefront from the slit 181*b* is equiphase in the y-direction, the phase measured in Step 1004 includes information about y-direction wavefront aberration of the projection optical system 160.

Next, the controller 190 joins information about x and y direction wavefront aberration of the projection optical system 160 acquired in steps 1002 and 1004 to obtain the wave front aberration information of the projection optical system 160 (Step 1006). Further, by repeating steps 1002 to 1006 while changing an angle of field, it is possible to obtain wavefront aberration information across the whole angles of field of the projection optical system 160 (Step 1008). The controller 190 extracts rotational asymmetrical ingredients from the wavefront aberration at each angle of field, thereby finding distorted ingredients of the projection optical system 160, too (Step 1010). Further, the controller 190 can find field curvature of the projection optical system 160 from the rotational symmetrical ingredients of the wavefront aberration (Step 1012).

Thus, it is possible to measure the wavefront aberration of the projection optical system 160*a* at multiple field angles, distortions within field angles, and field curvature. Naturally, it is possible to carry out steps 1002 to 1006 as to one field angle, and to measure wavefront aberration only at one field angle.

As described above, this embodiment has the second illumination optical system 120 that doubles as an alignment optical system aligning the mask 152 and the plate 172. It uses the condenser lens 126 to irradiate a beam onto an alignment mark (not shown) located on the mask stage 150. The irradiated alignment mark is used by the condenser lens 126 and a relay lens 127 to form an intermediate image on the reference mark 128. The intermediate image of the alignment mark and the reference mark are image-formed to the imaging means 130 of a CCD, and the like, by an erector lens 129. The amount of difference between the alignment mark image and reference mark image formed on the imaging means 130 is measured to determine the positioning of the mask stage 150. In a similar manner, the alignment mark (not shown) on the wafer stage 170 can be image-formed to the imaging means 130 via the projection optical system 160 to align the wafer stage 170.

In this embodiment, since the alignment scope and a part of the measuring device 101 (illumination section) are made common, the apparatus is simplified, contributing to cost reduction. Naturally, these devices can be made separate.

Figure 14:
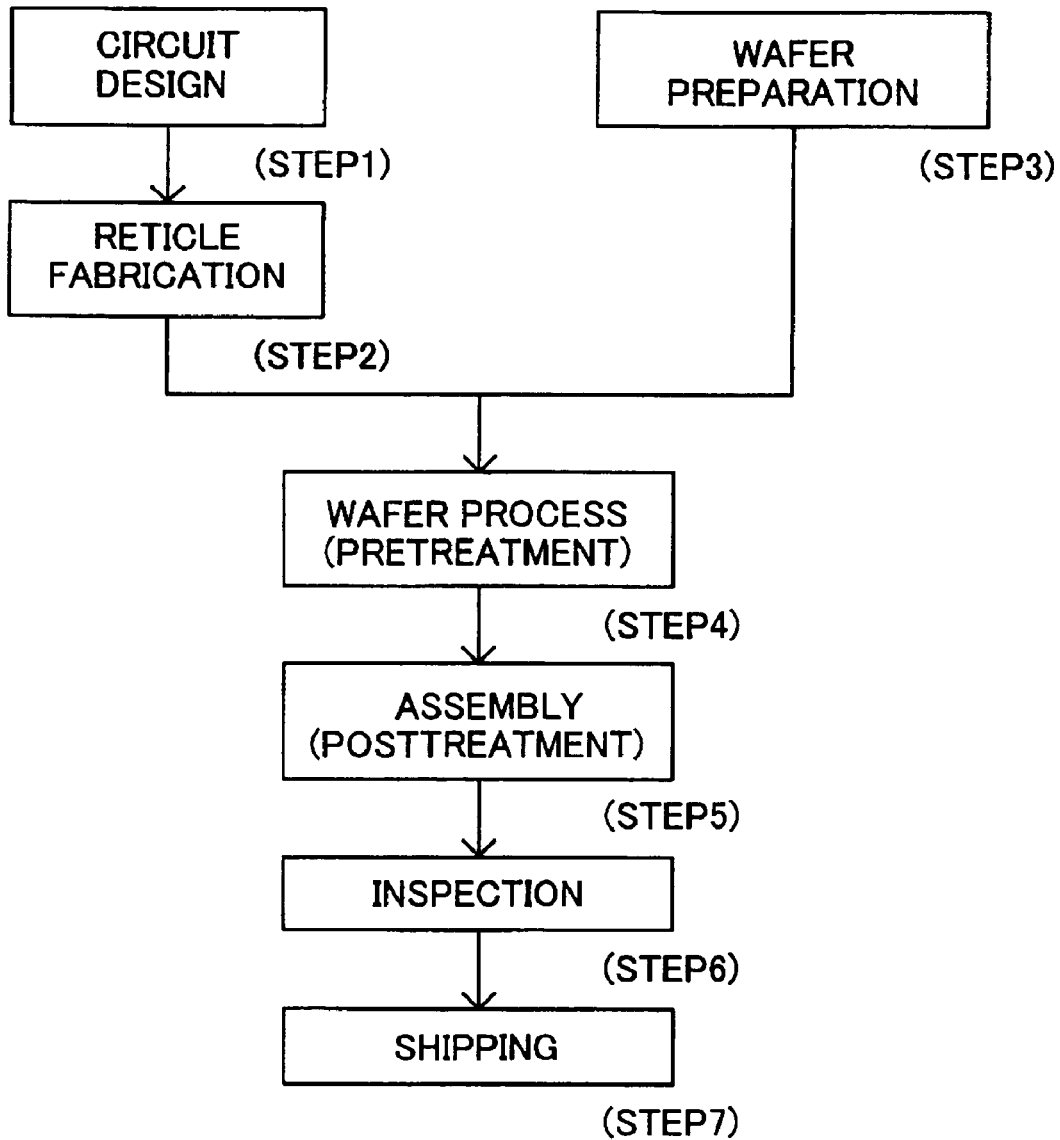
FIG. 14 is a flowchart for explaining a fabrication of devices (such as semiconductor chips, like ICs, LSIs, and the like, LCDs, CCDs, etc.).

Next, referring to FIGS. 14 and 15, a description will be given of an embodiment of a device manufacturing method using the afore-mentioned exposure apparatus 100. FIG. 14 is a flowchart for explaining a fabrication of devices (e.g., semiconductor chips such as ICs and LSIs, LCDs, CCDs, etc.). In this embodiment, a description will be given of fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

Figure 15:
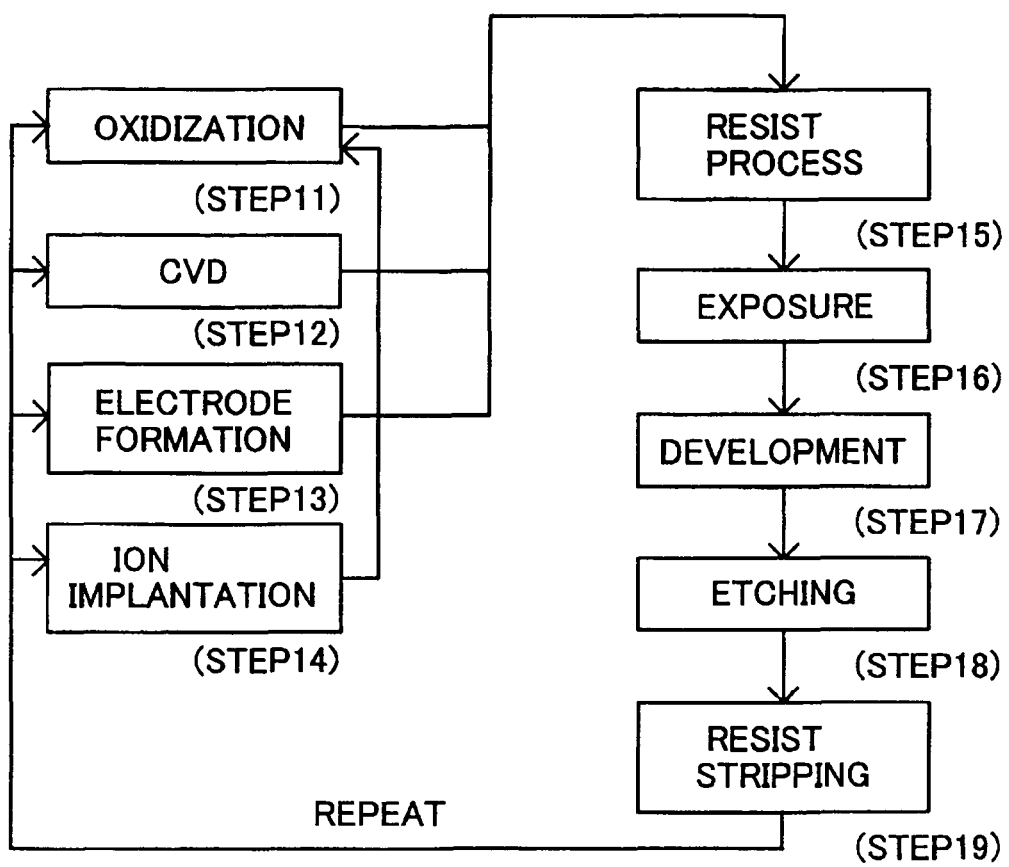
FIG. 15 is a detailed flowchart for a wafer process in Step 4 shown in FIG. 14.

FIG. 15 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 300 to expose a circuit pattern on the mask onto the wafer. Step 17 (development) develops the exposed wafer. Step 18 (etching) etches parts other than a developed resist image. Step 19 (resist stripping) removes unused resist after etching. These steps are repeated, and multilayer circuit patterns are formed on the wafer. The fabrication method of the present embodiment may manufacture higher quality devices than does the prior art. In this manner, the device fabricating method that uses the exposure apparatus 100 and the device as a final product serve as other aspects according to the present invention.

Further, the present invention is not limited to these preferred embodiments, and various variations and modifications may be made without departing from the spirit and scope of the present invention. For example, the optical units 10 to 10C are not limited to projection optical systems, and can be applied to illumination optical systems.

What is claimed is:

1. An optical unit comprising:
   a plate;
   an optical element;
   a deforming device, located between said plate and said optical element, for applying a deforming force to said optical element, asymmetrically changing a surface shape of said optical element, wherein said deforming device includes (i) a plurality of deforming poles for contacting a back surface of said optical element and (ii) actuators for linearly displacing said plurality of deforming poles between said plate and said optical element; and
   a support pole, which does not include an actuator, one end of said support pole being connected to said plate and the other end of said support pole being connected to a central portion of the back surface of said optical element, wherein said support pole rigidly fixes said optical element to said plate and prevents displacement of at least a portion of said optical element, in order to counter moments applied by the deforming force of said deforming device,
   wherein each of said plurality of deforming poles of said deforming device are located closer to a circumferential edge of said optical element than is said support pole.

2. An optical unit according to claim 1, further comprising:
   a measuring device for measuring aberration of said optical element; and
   a controller for calculating a driving amount of at least one of said plurality of actuators based on a measurement result of said measuring device, and for controlling the deforming force of said deforming device.

3. An optical unit according to claim 1, further comprising a cooling mechanism that cools said deforming device.

4. An optical unit according to claim 1, further comprising a shape maintaining mechanism that prevents deformations of said optical element caused by an own weight of said optical element.

5. An optical unit according to claim 4, wherein said shape maintaining mechanism includes (i) a first plurality of magnets located along the back surface of the optical element and (ii) a second plurality of magnets at each of the plurality of actuators such that the same polarity is opposed along said deforming device.

6. An optical unit according to claim 1, wherein said plurality of deforming poles of said deforming device contact the back surface of said optical element with three points in a radial direction of said optical element, and eight points in a circumferential direction of said optical element, at forty-five degree intervals.

7. An optical unit according to claim 1, wherein said support pole is made of a highly rigid material with a low-thermal expansion property.

8. An exposure apparatus comprising:
   (a) an optical unit comprising:
      (i) a plate;
      (ii) an optical element;
      (iii) a deforming device, located between said plate and said optical element, for applying a deforming force to said optical element, asymmetrically changing a surface shape of said optical element, wherein said deforming device includes (1) a plurality of deforming poles for contacting a back surface of said optical element and (2) actuators for linearly displacing said plurality of deforming poles between said plate and said optical element;

(iv) a support pole, which does not include an actuator, one end of said support pole being connected to said plate and the other end of said support pole being connected to a central portion of the back surface of said optical element, wherein said support pole rigidly fixes said optical element to said plate and prevents displacement of at least a portion of said optical element, in order to counter moments applied by the deforming force of said deforming device; and (b) an exposure unit for exposing an original pattern onto said plate, wherein each of said plurality of deforming poles of said deforming device are located closer to a circumferential edge of said optical element than is said support pole.

9. A device manufacturing method comprising the steps of:
(a) exposing an original pattern onto a plate with an exposure apparatus comprising:
   (i) a plate;
   (ii) an optical element;
   (iii) a deforming device, located between the plate and the optical element, for applying a deforming force to the optical element, asymmetrically changing a surface shape of the optical element, wherein the deforming device includes (1) a plurality of deforming poles for contacting a back surface of the optical element and (2) actuators for linearly displacing the plurality of deforming poles between the plate and the optical element;
   (iv) a support pole, which does not include an actuator one end of the support pole being connected to the back surface of the plate and the other end of the support pole being connected to a central portion of the back surface of the optical element, wherein the support pole rigidly fixes the optical element to the plate and prevents displacement of at least a portion of the optical element, in order to counter moments applied by the deforming force of the deforming device; and
   (v) an exposure unit for exposing an original pattern onto the plate; and
(b) developing the plate that has been exposed, in order to manufacture a device,
wherein each of the plurality of deforming poles of the deforming device are located closer to a circumferential edge of the optical element than is the support pole.

10. An exposure apparatus comprising:
(a) an optical unit comprising:
   (i) a plate;
   (ii) an optical element;
   (iii) a deforming device, located between said plate and said optical element, for applying a deforming force to said optical element, asymmetrically changing a surface shape of said optical element, wherein said deforming device includes (1) a plurality of deforming poles for contacting a back surface of said optical element and (2) actuators for linearly displacing said plurality of deforming poles between the plate and said optical element; and
   (iv) a support pole, which does not include an actuator, one end of said support pole being connected to said plate and the other end of said support pole being connected to a central portion of the back surface of said optical element, wherein said support pole rigidly fixes said optical element to said plate and prevents displacement of at least a portion of said optical element, in order to counter moments applied by the deforming force of said deforming device;
(b) a calculator for calculating wavefront aberrations of said optical element;
(c) an adjustor for adjusting a deforming force of said deforming device based on the calculated wavefront aberrations; and
(d) an exposure unit for exposing an original pattern onto said plate,
wherein each of said plurality of deforming poles of said deforming device are located closer to a circumferential edge of said optical element than is said support pole.

11. An optical unit comprising:
a plate;
an optical element;
a deforming device, located between said plate and said optical element, for applying a deforming force to said optical element, asymmetrically changing a surface shape of said optical element, wherein said deforming device includes (i) a plurality of deforming poles for contacting a back surface of said optical element and (ii) actuators for linearly displacing said plurality of deforming poles between said plate and said optical element; and
a support pole, which does not include an actuator, one end of said support pole being connected to said plate and the other end of said support pole being connected to a central portion of the back surface of said optical element, wherein said support pole rigidly fixes said optical element to said plate,
wherein each of said plurality of deforming poles of said deforming device are located closer to a circumferential edge of said optical element than is said support pole.

* * * * *